(12) United States Patent
Hirano

(10) Patent No.: US 7,249,509 B2
(45) Date of Patent: Jul. 31, 2007

(54) ANGULAR VELOCITY DETECTOR

(75) Inventor: Kenji Hirano, Kariya (JP)

(73) Assignee: DENSO Corporation, Kariya (JP)

( * ) Notice: Subject to any disclaimer, the term of this patent is extended or adjusted under 35 U.S.C. 154(b) by 106 days.

(21) Appl. No.: 11/156,458

(22) Filed: Jun. 21, 2005

(65) Prior Publication Data
US 2006/0005624 A1    Jan. 12, 2006

(30) Foreign Application Priority Data
Jul. 8, 2004 (JP) ............................. 2004-201815

(51) Int. Cl.
*G01P 9/04* (2006.01)
(52) U.S. Cl. ..................... 73/504.12; 73/493
(58) Field of Classification Search .................. 73/493, 73/504.12
See application file for complete search history.

(56) References Cited

U.S. PATENT DOCUMENTS 6,658,937 B2   12/2003   Ao et al.

2001/0055836 A1 *  12/2001  Kunda ........................ 438/108
2004/0020291 A1 *   2/2004  Katsumata et al. ....... 73/514.32
2005/0178203 A1 *   8/2005  Goto ........................ 73/514.16

FOREIGN PATENT DOCUMENTS

JP         B1-3020496        3/2000

* cited by examiner

*Primary Examiner*—John E. Chapman
(74) *Attorney, Agent, or Firm*—Posz Law Group, PLC

(57) ABSTRACT

An angular velocity detector includes an angular velocity detecting element having a vibrating body arranged in a base substrate to be vibrated on a surface horizontal with respect to the base substrate. The angular velocity detecting element detects an angular velocity around an axis perpendicular to the base substrate based on a vibration of the vibrating body. In the angular velocity detector, a circuit substrate is bonded to a first surface of the base substrate through an adhesive, and a second surface of the angular velocity detecting element is electrically connected to the circuit substrate through a bonding wire. Furthermore, the adhesive is partially arranged on the first surface of the base substrate at least at a portion corresponding to a bonding portion of the bonding wire on the second surface of the base substrate. Therefore, a wire bonding can be easily accurately performed.

17 Claims, 6 Drawing Sheets

ANGULAR VELOCITY DETECTOR

CROSS REFERENCE TO RELATED APPLICATION

This application is based on Japanese Patent Application No. 2004-201815 filed on Jul. 8, 2004, the contents of which are incorporated herein by reference in its entirety.

FIELD OF THE INVENTION

The present invention relates to an angular velocity detector having an angular velocity detecting element in which a vibrating body is arranged in a substrate and an angular velocity around the axis perpendicular to the substrate is detected on the basis of vibration of this vibrating body. The angular velocity detector is formed by laminating an angular velocity detecting element on a circuit substrate through an adhesive.

BACKGROUND OF THE INVENTION

An angular velocity detecting element generally has a substrate such as a semiconductor substrate, etc., and a vibrating body able to be vibrated on a surface horizontal with respect to this substrate is formed.

The vibrating body is operated and vibrated in a first direction on the horizontal surface. When the angular velocity is applied to the vibrating body on the basis of this driving vibration, the vibrating body is vibrated in a second direction perpendicular to the first direction on this horizontal surface by Coriolis force.

The angular velocity around the axis perpendicular to the substrate can be detected by detecting a vibrating state of the vibrating body in this second direction.

In such an angular velocity detecting element, the detecting accuracy of the angular velocity may be reduced by applying external acceleration. For example, when an external acceleration component is superposed on the vibration of the vibrating body, this external acceleration component is detected as the angular velocity.

Therefore, a vibration proof structure for holding the angular velocity detecting element within a case by using an elastic member is conventionally proposed (e.g., JP-B1-3020496). This structure does not deteriorate detecting efficiency of the angular velocity because this structure has high rigidity around a sensitive axis while having the vibration proof effect of transmitting no external vibration to the angular velocity detecting element. However, in this case, a space for the vibration proof device is required and the number of parts is increased and cost is also increased.

In contrast, a device forming a structural body by mounting an angular velocity detecting element onto a package through an adhesive of a low Young's modulus is proposed (e.g., U.S. Pat. No. 6,658,937 corresponding to JP-A-2003-28644). In this device, a reduction in the detecting accuracy of the angular velocity using the application of the external acceleration is restricted by reducing a resonance frequency of this structural body. However, in this case, the angular velocity detecting element is directly bonded to the package through the adhesive, and a wire bonding between the angular velocity detecting element and a circuit substrate is unnecessary.

SUMMARY OF THE INVENTION

The inventors of the present application considered an angular velocity detector in which an angular velocity detecting element is laminated on a circuit substrate through an adhesive of a low Young's modulus, for preventing a reduction in the detecting accuracy of the angular velocity. Here, the circuit substrate is used for processing a signal from this angular velocity detecting element.

In this case, resonance frequency of this detector can be reduced by reducing an adhering area of the adhesive. However, when the adhering area of the adhesive is simply reduced, the following problems are caused. When the angular velocity detecting element is laminated on the circuit substrate, it is necessary to connect a surface of the substrate of the angular velocity detecting element and the circuit substrate by a bonding wire, and to electrically connect both the angular velocity detecting element and the circuit substrate.

Further, when the adhering area of the adhesive is simply reduced, the supporting of the angular velocity detecting element using the adhesive becomes insufficient. Therefore, when the wire bonding is performed, there is a possibility that the substrate of the angular velocity detecting element is inclined and wire bonding may be not performed.

In view of the above problem, it is an object of the present invention to provide an angular velocity detector in which an angular velocity detecting element is laminated on a circuit substrate through an adhesive. The angular velocity detector reduces resonance frequency of a structural body by reducing an adhering area of the adhesive while easily and accurately performing a wire bonding between the angular velocity detecting element and the circuit substrate.

According to an angular velocity detector of the present invention, an angular velocity detecting element includes a base substrate, and a vibrating body arranged in the base substrate to be vibrated on a surface horizontal with respect to the base substrate. The angular velocity detecting element detects an angular velocity around an axis perpendicular to the base substrate based on a vibration of the vibrating body, and a circuit substrate is laminated with the angular velocity detecting element to be bonded to a first surface of the base substrate of the angular velocity detecting element through an adhesive. Furthermore, a second surface of the base substrate of the angular velocity detecting element, opposite to the first surface, is electrically connected to the circuit substrate through a bonding wire, and the adhesive is partially arranged on the first surface of the base substrate at least at a portion corresponding to a bonding portion of the bonding wire on the second surface of the base substrate.

Because the adhesive is partially arranged on the base substrate, the bonding area of the adhesive can be made smaller, the resonance frequency of this detector can be effectively reduced, and an external acceleration component of a vibration frequency area of the vibrating body, transmitted to the vibrating body, is reduced, and the angular velocity can be accurately detected. Furthermore, because the adhesive is partially arranged on the first surface of the base substrate at least at a portion corresponding to a bonding portion of the bonding wire on the second surface of the base substrate, wire bonding of the bonding wire can be easily performed.

Alternatively, the adhesive is partially arranged on the first surface of the base substrate in an arrangement area, and the bonding wire is connected to the angular velocity detecting element at a position within a projecting area on the second surface of the arrangement area of the adhesive. In this case, the wire bonding of the bonding wire can be easily accurately performed.

For example, the angular velocity detecting element is arranged above the circuit substrate, and the adhesive is partially provided on the first surface of the base substrate below the bonding portion of the bonding wire in the base substrate. In this case, the wire bonding can be more easily performed. Furthermore, a plurality of the bonding wires can be arranged at different bonding portions in the base substrate. In this case, the adhesive is partially arranged on the first surface of the base substrate at least at portions corresponding to the bonding portions of the bonding wires in the base substrate.

The adhesive can be arranged at a peripheral portion of the first surface of the base substrate symmetrically, to support the angular velocity detecting element. In this case, it can prevent the base substrate from being inclined, and the wire bonding can be easily accurately performed.

For example, the base substrate has a rectangular shape. In this case, the adhesive may be arranged partially at four corner areas of the first surface of the base substrate, may be arranged partially at two opposite peripheral areas of the base substrate, or may be arranged partially at an entire peripheral area of the base substrate.

BRIEF DESCRIPTION OF THE DRAWINGS

The above and other objects, features and advantages of the present invention will become more apparent from the following detailed description of preferred embodiments made with reference to the accompanying drawings, in which.

DETAILED DESCRIPTION OF PREFERRED EMBODIMENTS

First Embodiment

Figure 1A:
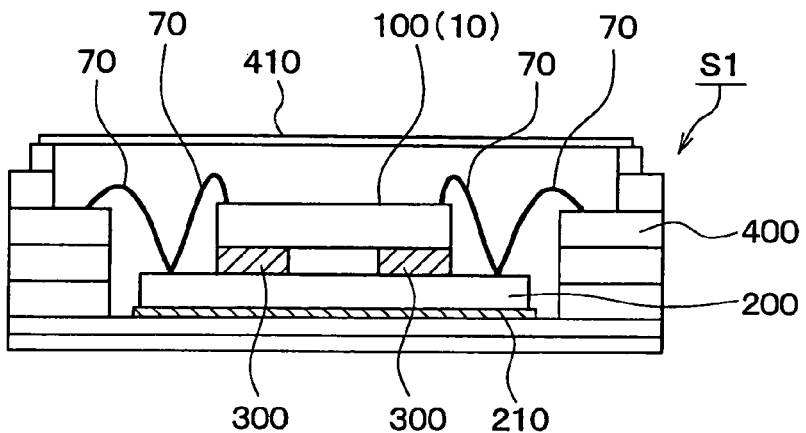
FIG. 1A is a schematic sectional view showing an angular velocity detector (oscillatory angular rate detector)

As shown in FIG. 1, an angular velocity detector S1 of this embodiment includes an angular velocity detecting element 100, a circuit substrate 200 and a package 400 for accommodating the angular velocity detecting element 100 and the circuit substrate 200. The circuit substrate 200 is fixed to the package 400. The angular velocity detector S1 is constructed as a structural body in which the angular velocity detecting element 100 is laminated on the circuit substrate. 200 through an adhesive 300.

First, the angular velocity detecting element 100 will be described with reference to FIG. 2. The angular velocity detecting element 100 has a substrate 10 (base substrate) such as a semiconductor substrate, etc., and is formed by performing well-known micro machine processing with respect to this substrate 10.

For example, a rectangular SOI (silicon-on-insulator) substrate can be used as the substrate 10. The rectangular SOI can be formed by sticking a second silicon layer as a second semiconductor layer through an oxide film as an insulating layer on a first silicon layer as a first semiconductor layer.

Figure 2:
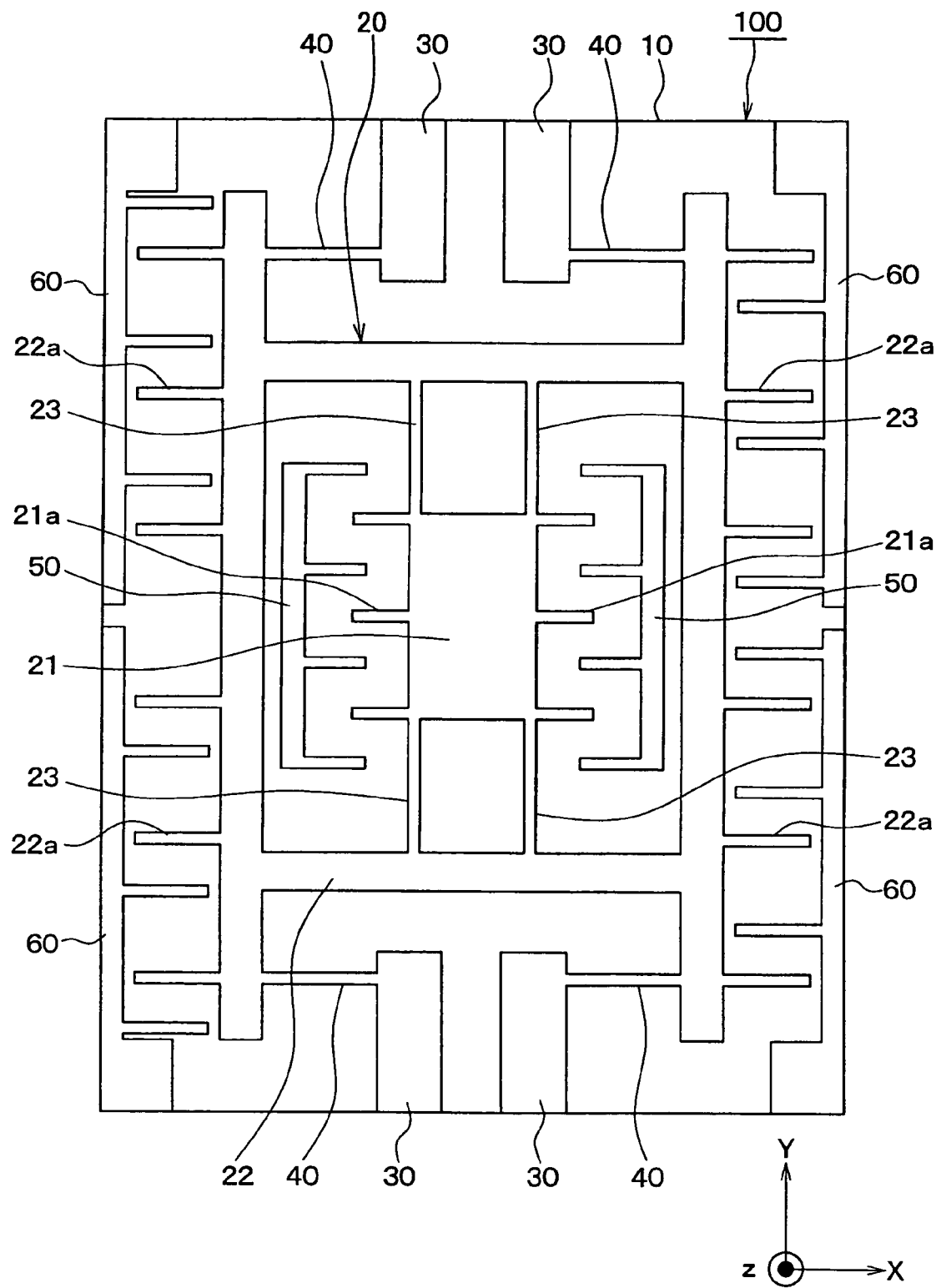
FIG. 2 is a schematic plan view showing the angular velocity detecting element in the angular velocity detector.

As shown in FIG. 2, beam structural bodies 20 to 60 partitioned by grooves are formed by performing trench etching, release etching, etc. with respect to a surface layer of this substrate 10, e.g., the second silicon layer in the SOI substrate.

These beam structural bodies 20 to 60 are constructed with a vibrating body 20, respective beam portions 23, 40 and respective electrodes 50, 60.

The vibrating body 20 is formed in a central portion of the substrate 10 so as to be vibrated on a surface horizontal with respect to the substrate 10, i.e., on the paper surface within FIG. 2. In this example, the vibrating body 20 is constructed with a first vibrating portion 21 located in the central portion and approximately formed in a rectangular shape, a second vibrating portion 22 of a rectangular frame shape located at an outer circumference of this first vibrating portion 21, and a driving beam portion 23 for connecting these first and second vibrating portions 21, 22.

This vibrating body 20 is connected to an anchor portion 30 arranged at a peripheral portion of the substrate 10, through a detecting beam portion 40. Here, the anchor portion 30 is fixed and supported by a lower portion of the surface layer forming the vibrating body 20 in the substrate 10, i.e., by a support substrate portion. The vibrating body 20 is floated from this support substrate portion.

As shown in FIG. 2, the driving beam portion 23 can be elastically deformed substantially in only the x-direction by forming this driving beam portion 23 in a shape extending in e.g., the y-direction. The detecting beam portion 40 can be elastically deformed substantially in only the y-direction by forming this detecting beam portion 40 in a shape extending in e.g., the x-direction.

A first vibrating body portion in the vibrating body 20 can be vibrated by the driving beam portion 23 in the x-direction (drive vibrating direction) on the surface horizontal with respect to the substrate 10. In contrast to this, the entire vibrating body 20 can be vibrated by the detecting beam portion 40 in the y-direction (detection vibrating direction) on the surface horizontal with respect to the substrate 10.

A driving electrode 50 for operating and vibrating the first vibrating portion 21 in the x-direction is arranged between the first vibrating portion 21 and the second vibrating portion 22. Similar to the anchor portion 30, the driving electrode 50 is fixed to the support substrate portion. The driving electrode 50 is arranged so as to be opposed to a comb teeth portion (comb teeth portion for driving) 21*a* projected from the first vibrating portion 21 such that the mutual comb teeth are engaged with each other.

A detecting electrode 60 is arranged in the outer circumference of the second vibrating portion 22. The detecting electrode 60 is arranged to detect an angular velocity around the z-axis perpendicular to the substrate 10 on the basis of the vibration of the vibrating body 20. Similar to the anchor portion 30, the detecting electrode 60 is fixed to the support substrate portion. The detecting electrode 60 is arranged so as to be opposed to a comb teeth portion (comb teeth portion for detection) 22*a* projected from the second vibrating portion 22 such that the mutual comb teeth are engaged with each other.

In the angular velocity detecting element 100, a pad (not shown) for applying voltages to the vibrating body 20, the driving electrode 50, the detecting electrode 60, etc., and for taking-out signals is arranged in a suitable portion of the upper surface of the substrate 10.

In this embodiment, as shown in FIG. 1, the pad is arranged in a peripheral portion of the substrate 10. A bonding wire 70 made of Au (gold), Al (aluminum), etc., is connected to this pad.

Thus, the upper surface of the substrate 10 of the angular velocity detecting element 100 and the circuit substrate 200 are electrically connected by the bonding wire 70. This bonding wire 70 can be formed by a normal wire bonding technique.

In this circuit substrate 200, for example, a MOS transistor, a bipolar transistor, etc., are formed by using a well-known semiconductor process with respect to a silicon substrate, etc. The circuit substrate 200 can be set to have a function for sending a voltage to the angular velocity detecting element 100 and for processing an electric signal from the angular velocity detecting element 100 and externally outputting this signal.

As shown in FIG. 1A, this circuit substrate 200 is fixed to the package 400 through an adhesive member 210.

Here, the package 400 has unillustrated wiring in the interior or the surface, etc. The circuit substrate 200 and the wiring of the package 400 are electrically connected by the bonding wire 70. The output signal from the circuit substrate 200 is sent to the exterior from the wiring of the package 400 through the bonding wire 70.

For example, this package 400 can be formed of a laminating substrate in which plural ceramic layers of alumina, etc., are laminated. In the laminating substrate, the wiring of the package 400 is formed between the respective layers, and each wiring is electrically conducted by a through hole, etc. As shown in FIG. 1, a cover 410 is attached to an opening portion of the package 400, and the cover 410 seals the interior of the package 400.

Here, as shown in FIG. 1A, the angular velocity detecting element 100 is laminated on the circuit substrate 200 through the adhesive 300. Furthermore, the circuit substrate 200 is fixed to the package 400 through the adhesive member 210. However, in this embodiment, the adhesive 300 is partially arranged below a part area of the substrate 10 of the angular velocity detecting element 100, connected to the bonding wire 70. Specifically, as shown in FIG. 1C, the substrate 10 has a first surface attached to the circuit substrate 200 through the adhesive 300, and a second surface opposite to the first surface and connected to the bonding wires 70 at bonding positions 70*a*.

Figure 1B:
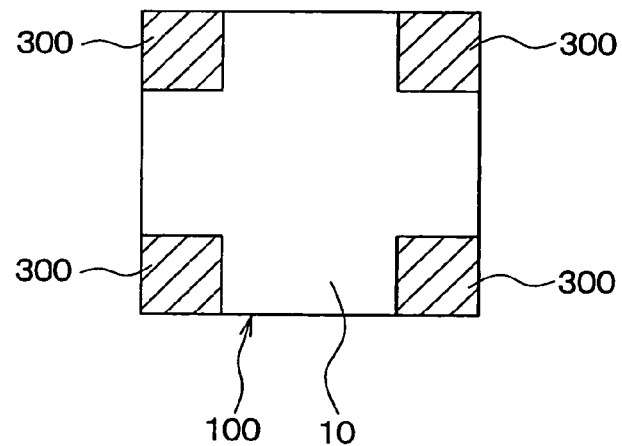
FIG. 1B is a schematic plan view showing an adhering area of an adhesive on an angular velocity detecting element.
Figure 1C:
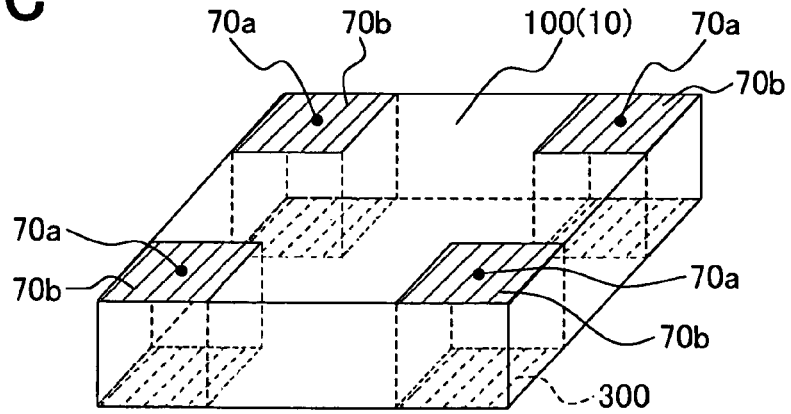
FIG. 1C is a schematic perspective view showing arrangement positions of a bonding wire and the adhesive, according to a first preferred embodiment of the present invention.

As shown in FIGS. 1B and 1C, the adhesive 300 is partially arranged at adhesive arrangement areas (e.g., four corner areas) on the first surface of the substrate 10, and the bonding portions 70*a* of the bonding wires 70 are positioned on the second surface of the substrate 10 within projecting parts 70*b* of the adhesive arrangement areas, respectively. In this case, the bonding wires 70 can be easily accurately bonded to the substrate 10.

The adhesive 300 may be arranged in the central portion or in the peripheral portion of the substrate 10 if this adhesive 300 is partially arranged below the part connected to the bonding wire 70 in the substrate 10 of the angular velocity detecting element 100. That is, the adhesive 300 may be arranged partially on the first surface of the substrate 10 if the bonding wires 70 are positioned within the projecting areas 70*b* of the adhesive 300 on the second surface of the substrate 10.

As an example, the adhesive 300 is provided in the peripheral corner areas of the first surface (bottom surface in FIG. 1A) of the substrate 10, and the bonding wires 70 are connected at bonding portions 70*a* within the peripheral projecting areas 70*b* on the second surface (upper surface in FIG. 1A) of the substrate 10 of the angular velocity detecting element 100.

When the adhesive 300 is partially arranged in the peripheral corner area in the substrate 10 of the angular velocity detecting element 100 as shown in FIGS. 1B and 1C, the adhesive 300 stably supports the angular velocity detecting element 100, and the wire bonding can be easily accurately performed.

In this example shown in FIG. 1B, the substrate 10 of the angular velocity detecting element 100 is formed in a rectangular plate shape, and the adhesive 300 is partially arranged in the four corner portions of the substrate 10.

A liquid adhesive material capable of performing coating and hardening may be used as this adhesive 300. A film-type adhesive for performing sticking by heating and pressurization, etc. may be also used as the adhesive 300. Further, the adhesive 300 preferably has a low Young's modulus of 2 MPa or less, e.g., about 1.6 MPa.

For example, a silicon group, an epoxy group, a polyimide group, an acrylic group, a urethane group, a rubber group, a liquid crystal polymer, etc. can be adopted as the adhesive 300 having a low Young's modulus.

In an angular velocity detector S1 of this embodiment, for example, the circuit substrate. 200 is fixed to the package 400 through the adhesive member 210, and the adhesive 300 is arranged on the circuit substrate 200 and the angular velocity detecting element 100 is adhered onto this adhesive 300. Thereafter, the wire bonding is performed and the cover 410 is further attached so that the angular velocity detector S1 can be manufactured.

In the angular velocity detector S1, a driving signal (sine wave voltage, etc.) is applied from the circuit substrate 200 to the driving electrode 50 through the bonding wire 70, and electrostatic force is generated between the comb teeth portion 21*a* of the above first vibrating portion 21 and the driving electrode 50. Thus, the first vibrating portion 21 is driven and vibrated in the x-direction by the elastic force of the driving beam portion 23.

When an angular velocity Ω is applied around the z-axis on the basis of the driving vibration of this first vibrating portion 21, Coriolis force is applied to the first vibrating portion 21 in the y-direction, and the entire vibrating body 20 is vibrated in the y-direction by the elastic force of the detecting beam portion 40.

The capacity between the detecting electrode 60 and the comb teeth of the comb teeth portion 22a for detection is changed by this vibration in the y-direction. Therefore, the magnitude of the angular velocity Ω can be calculated by detecting this capacity change.

For example, when the vibrating body 20 is displaced in one direction along the y-axis direction in FIG. 2, the detecting electrode 60 of the left side and the detecting electrode 60 of the right side in the left and right detecting electrodes 60 in FIG. 2 are set to be reverse to each other in the capacity change. Therefore, the angular velocity is calculated by converting the respective capacity changes in the left and right detecting electrodes 60 into voltages and by differentiating, amplifying and outputting both the voltage values.

In accordance with this embodiment, the angular velocity detecting element 100 includes the substrate 10, and the vibrating body 20 arranged in the substrate 10 and able to be vibrated on the surface horizontal with respect to the substrate 10, and detects the angular velocity around the axis perpendicular to the substrate 10 on the basis of the vibration of the vibrating body 20. In the angular velocity detector in which the angular velocity detecting element 100 is laminated on the circuit substrate 200 through the adhesive 300, the upper surface of the substrate 10 of the angular velocity detecting element 100 and the circuit substrate 200 are connected by the bonding wire 70. The adhesive 300 is partially arranged on the substrate 10 below the parts connected to the bonding wires 70 in the substrate 10 of the angular velocity detecting element 100, as shown in FIG. 1C In accordance with this construction, because the adhesive 300 is partially arranged below the part connected to the bonding wire 70 in the substrate 10 of the angular velocity detecting element 100, the adhering area of the adhesive 300 is reduced and the resonance frequency of the angular velocity detector, i.e., the structural body in the direction along the horizontal surface of this substrate 10 can be reduced.

Furthermore, the adhesive 300 is partially arranged at adhesive arrangement areas (e.g., four corner areas) on the first surface of the substrate 10, and the bonding portions 70a of the bonding wires 70 are positioned on the second surface of the substrate 10 within the projecting parts 70b of the adhesive arrangement areas, respectively. In this case, the bonding wires 70 can be accurately bonded to the substrate 10.

The external acceleration component of a vibration frequency area of the vibrating body 20 transmitted to the vibrating body 20 is attenuated and the detecting accuracy of the angular velocity can be improved by setting the resonance frequency of this structural body to be sufficiently lower than that of the vibrating body 20.

Further, each part connected to the bonding wire 70 in the substrate 10 of the angular velocity detecting element 100 is positioned in the projecting parts 70b of the adhesive arrangement areas of the adhesive 300. Therefore, no substrate 10 is inclined in the wire bonding, and the wire bonding can be easily accurately performed.

In accordance with this embodiment, in the angular velocity detector S1 in which the angular velocity detecting element 100 is laminated on the circuit substrate 200 through the adhesive 300, the resonance frequency of the structural body is reduced by reducing the adhering area of the adhesive 300 and the wire bonding can be easily accurately performed.

In this example, the peripheral portion on the upper surface of the substrate 10 of the angular velocity detecting element 100 and the circuit substrate 200 are connected by the bonding wire 70. Furthermore, because the adhesive 300 is partially arranged in the peripheral portion in the substrate 10 of the angular velocity detecting element 100, the angular velocity detecting element 100 is stably supported.

When the wire bonding is performed in this way in the peripheral portion of the substrate 10 of the angular velocity detecting element 100, it is sufficient for the adhesive 300 to be arranged in the peripheral portion of the substrate 10 and be able to realize a stable support state such that this substrate 10 is not inclined at the wire bonding time. That is, in this case, it is not necessary for the adhesive 300 to be arranged just below the connecting portion of the bonding wire 70 in this substrate 10.

Thus, the resonance frequency of the angular velocity detector S1, i.e., the structural body in the direction along the horizontal surface of this substrate 10 can be reduced by reducing the adhering area of the adhesive 300. Further, the peripheral portion connected to the bonding wires 70 in the substrate 10 of the angular velocity detecting element 100 can be stably supported by the adhesive 300. Therefore, the wire bonding can be easily performed.

When the connecting portions of the bonding wires 70 in the substrate 10 of the angular velocity detecting element 100 are located in the peripheral portion of this substrate 10, the adhesive 300 is desirably set to a support state of at least two points, preferably, three points or more in the peripheral portion of this substrate 10. That is, the number of arranging points of the adhesive 300 is desirably increased so as to form a polygonal shape of a triangular shape or more when the arranging points of the adhesive 300 are connected.

As an example, in this embodiment, as shown in FIGS. 1A-1C, the substrate 10 of the angular velocity detecting element 100 is formed in the shape of a rectangular plate, and the adhesive 300 is arranged in the four corner portions of this substrate 10.

Second Embodiment

This embodiment differs from the above first embodiment in that the arranging pattern of the adhesive 300 is changed. This difference will be centrally described.

In the above first embodiment, in the substrate 10 of the angular velocity detecting element 100 formed in the rectangular plate shape, the adhesive 300 is arranged in the four corner portions of this substrate 10.

Figure 3A:
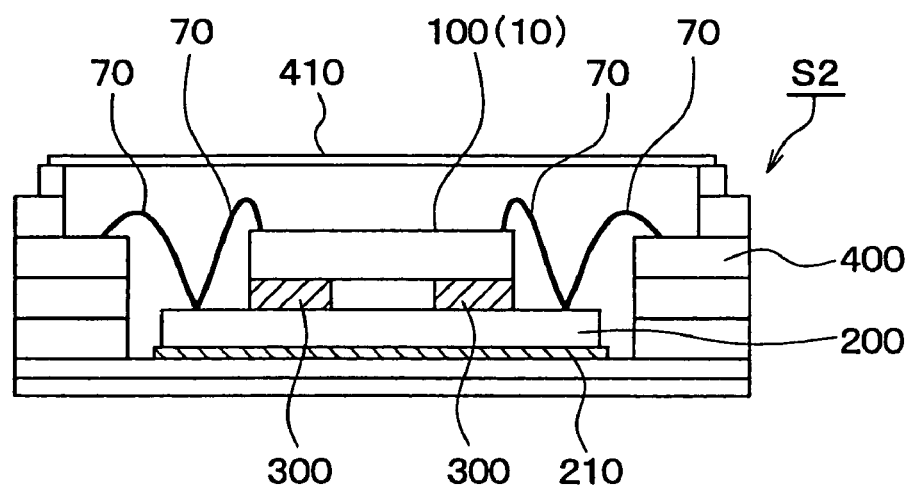
FIG. 3A is a schematic sectional view showing an angular velocity detector (oscillatory angular rate detector)
Figure 3B:
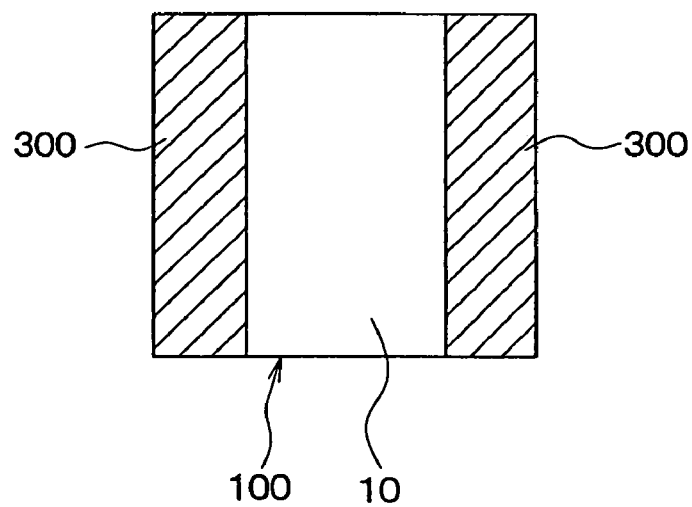
FIG. 3B is a schematic plan view showing an adhering area of an adhesive on an angular velocity detecting element, according to a second preferred embodiment of the present invention.

In contrast to this, in the second embodiment, as shown in FIG. 3B, in the substrate 10 of the angular velocity detecting element 100 formed in the rectangular plate shape, the adhesive 300 is arranged in two opposite side peripheral portions of the substrate 10.

Thus, the resonance frequency of the angular velocity detector, i.e., the structural body in the direction along the horizontal surface of this substrate 10 can be reduced by reducing the adhering area of the adhesive 300. Further, the peripheral portion connected to the bonding wire 70 in the substrate 10 of the angular velocity detecting element 100 can be stably supported by the adhesive 300. Therefore, the wire bonding can be easily performed.

Accordingly, in the second embodiment, in an angular velocity detector S2 in which the angular velocity detecting element 100 is laminated on the circuit substrate 200 through the adhesive 300, the resonance frequency of the structural body is reduced by reducing the adhering area of the adhesive 300, and the wire bonding can be easily accurately performed.

In the second embodiment, both the opposite side peripheral portions for arranging the adhesive 300 in this substrate 10 may be also set to the two remaining sides different from the two sides shown in FIG. 3B except for these two sides shown in FIG. 3B. In the second embodiment, the other parts of the angular velocity detector S2 may be made similarly to those of the angular velocity detector S1 of the above-described first embodiment.

Third Embodiment

This embodiment differs from the above embodiments in that the arranging pattern of the adhesive 300 is deformed. This difference will be centrally described.

In the above first and second embodiments, in the substrate 10 of the angular velocity detecting element 100 having the rectangular plate shape, the adhesive 300 is arranged in the four corner portions of this substrate 10, or is also arranged in both the opposite side portions in this substrate 10.

Figure 4A:
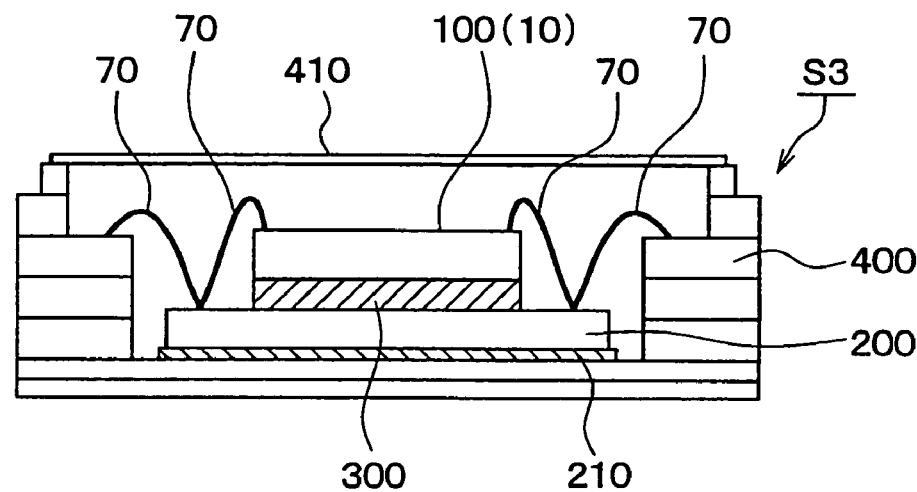
FIG. 4A is a schematic sectional view showing an angular velocity detector (oscillatory angular rate detector)
Figure 4B:
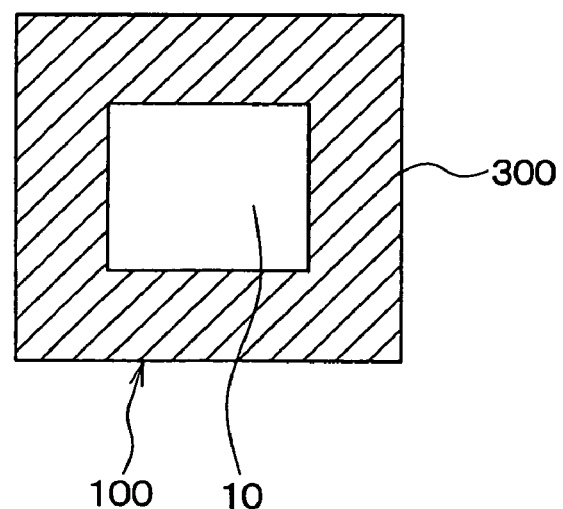
FIG. 4B is a schematic plan view showing an adhering area of an adhesive on an angular velocity detecting element, according to a third preferred embodiment of the present invention.

In contrast, in the third embodiment, as shown in FIGS. 4A and 4B, in the substrate 10 of the angular velocity detecting element 100 having the rectangular plate shape, the adhesive 300 is arranged in the entire periphery of a side portion of this substrate 10.

Thus, the resonance frequency of the angular velocity detector, i.e., the structural body in the direction along the horizontal surface of this substrate 10 can be reduced by reducing the adhering area of the adhesive 300. Further, the peripheral portion connected to the bonding wire 70 in the substrate 10 of the angular velocity detecting element 100 can be stably supported by the adhesive 300. Therefore, the wire bonding can be easily performed.

In the third embodiment, in an angular velocity detector S3 in which the angular velocity detecting element 100 is laminated on the circuit substrate 200 through the adhesive 300, the resonance frequency of the structural body is reduced by reducing the adhering area of the adhesive 300, and the wire bonding can be easily accurately performed. In the third embodiment, the other parts of the angular velocity detector S3 may be made similarly to those of the angular velocity detector S1 of the above-described first embodiment.

Fourth Embodiment

Figure 5A:
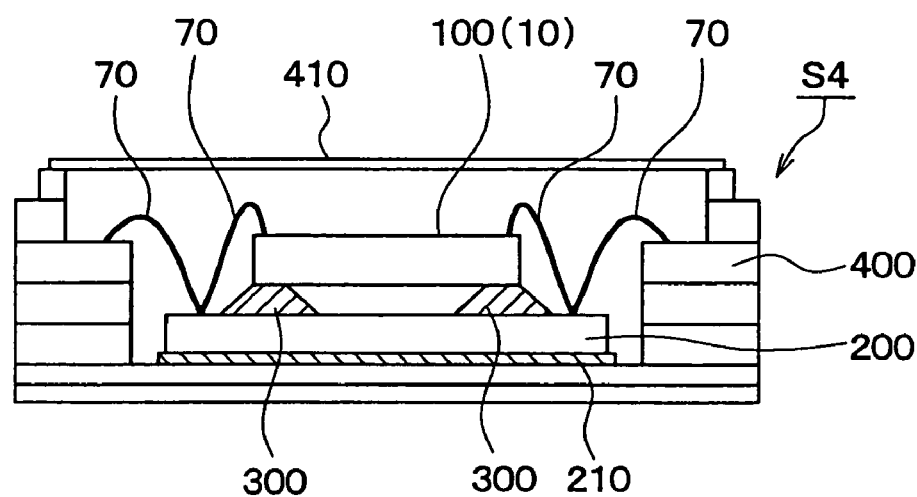
FIG. 5A is a schematic sectional view showing an angular velocity detector (oscillatory angular rate detector)
Figure 5B:
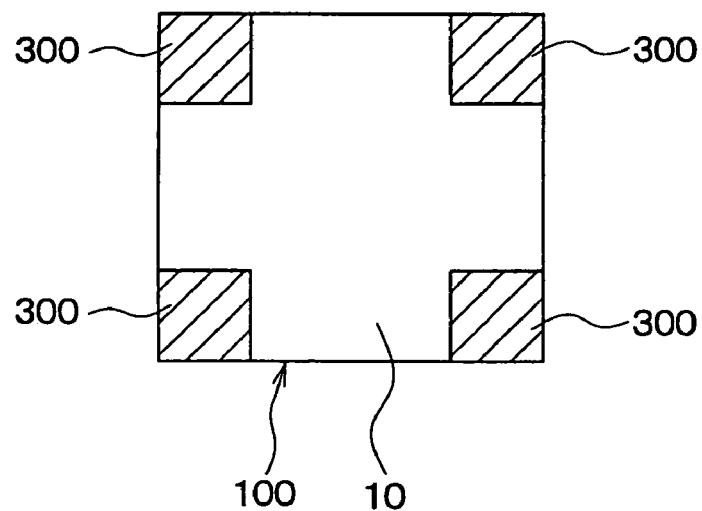
FIG. 5B is a schematic plan view showing an adhering area of an adhesive on an angular velocity detecting element, according to a fourth preferred embodiment of the present invention.
Figure 6A:
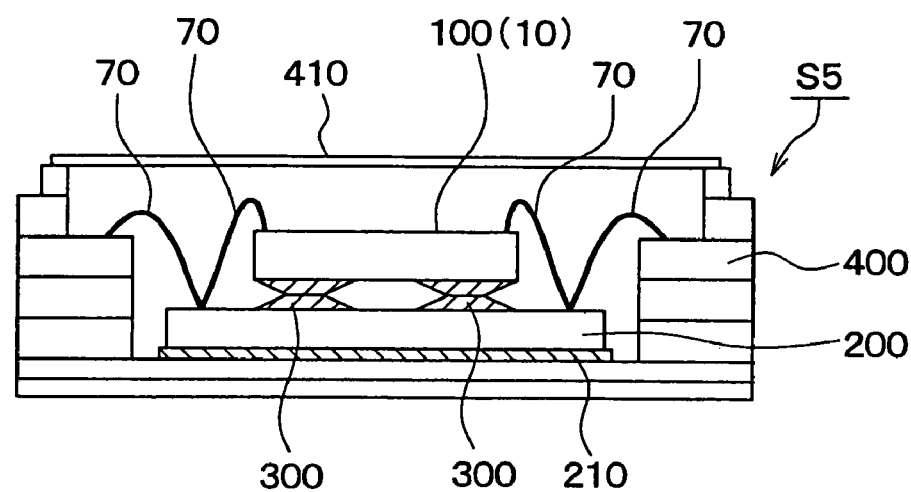
FIG. 6A is a schematic sectional view showing an angular velocity detector (oscillatory angular rate detector)
Figure 6B:
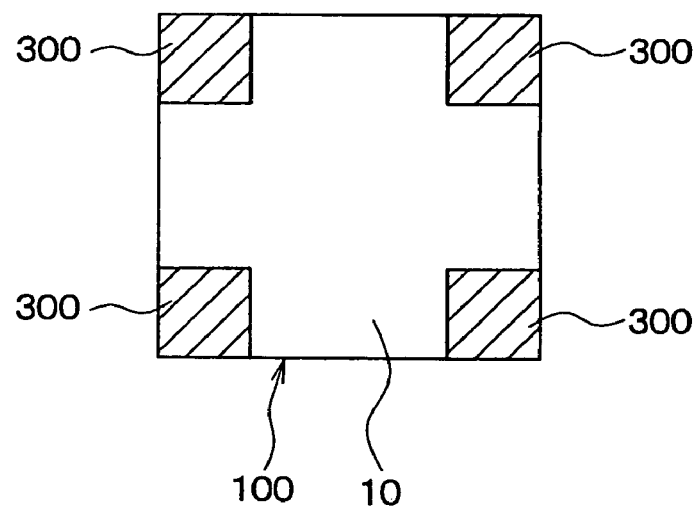
FIG. 6B is a schematic plan view showing an adhering area of an adhesive on an angular velocity detecting element, according to a fifth preferred embodiment of the present invention.

In this embodiment, the adhesive 300 is arranged in the four corner portions similarly to the above first embodiment, but the sectional shape of the individual adhesive 300 in its thickness direction is set to be different from the rectangular shape in the above first embodiment. That is, in this embodiment, the sectional shape of the adhesive 300 is set to a trapezoidal shape in which the upper side, i.e., the side on the angular velocity detecting element 100 is short as shown in FIG. 5A.

In accordance with the fourth embodiment, in comparison with the above first embodiment, it is possible to realize the shape of the adhesive 300 able to stably support the angular velocity detecting element 100. The adhesive 300 of the trapezoidal shape can be easily formed by using e.g., a film-shaped member and molding this film-shaped member in the trapezoidal shape by cutting-out processing.

Further, in this embodiment, in an angular velocity detector S4 in which the angular velocity detecting element 100 is laminated on the circuit substrate 200 through the adhesive 300, the resonance frequency of the structural body is reduced by reducing the adhering area of the adhesive 300 and the wire bonding can be easily performed.

In the adhesive 300 of the above second and third embodiments, a trapezoidal adhesive 300 as in the fourth embodiment may be also adopted. In the fourth embodiment, the other parts of the angular velocity detector S4 may be made similarly to those of the angular velocity detector S1 of the above-described first embodiment.

Fifth Embodiment

In the fifth embodiment, the adhesive 300 is arranged in the four corner portions similarly to the above first embodiment. However, the sectional shape of the individual adhesive 300 in its thickness direction is set to the rectangular shape in the above first embodiment. In contrast to this, the fifth embodiment differs from the above first embodiment in that the central portion of the adhesive 300 in its thickness direction is formed in a constricted shape.

In accordance with this construction of the fifth embodiment, even when the adhering area of the adhesive 300 with respect to the angular velocity detecting element 100 and the circuit substrate 200 is similar to that in the above first embodiment, it is possible to realize a lower frequency in the structural body because the central constricted portion of the adhesive 300 is thin.

The adhesive 300 having a constricted shape can be easily formed by connecting e.g., two film-shaped members cut out and processed in a trapezoidal shape, or by cutting-out and processing a film-shaped member in a single constricted shape, etc.

Further, in the fifth embodiment, in an angular velocity detector S5 in which the angular velocity detecting element 100 is laminated on the circuit substrate 200 through the adhesive 300, the resonance frequency of the structural body can be reduced by reducing the adhering area of the adhesive 300, and the wire bonding can be easily accurately performed.

In the adhesive 300 of the above second and third embodiments, the construction of the adhesive 300 of the constricted shape as in fifth embodiment may be also used.

In the fifth embodiment, the other parts of the angular velocity detector S5 may be made similarly to those of the angular velocity detector S1 of the above-described first embodiment.

Other Embodiments

Although the present invention has been described in connection with some preferred embodiments thereof with reference to the accompanying drawings, it is to be noted that various changes and modifications will become apparent to those skilled in the art.

For example, it is sufficient for the angular velocity detecting element 100 to have the substrate 10 and the vibrating body 20 arranged in the substrate 10 and able to be vibrated on the surface horizontal with respect to the substrate, and detect the angular velocity around the axis perpendicular to the substrate 10 on the basis of the vibration of the vibrating body 20. No angular velocity detecting element is limited to the angular velocity detecting element 100 as shown in the above embodiments.

Further, the angular velocity detector may be also set to a detector having no package 400 mentioned above. That is, it is not necessary that the laminating body provided by laminating the angular velocity detecting element 100 and the circuit substrate 200 is accommodated in the package 400. For example, in an angular velocity detector, this laminating body may be mounted to a printed-wiring board, a ceramic wiring board, etc., and electric connection using the wire bonding, etc. may be performed.

While the invention has been described with reference to preferred embodiments thereof, it is to be understood that the invention is not limited to the preferred embodiments and constructions. The invention is intended to cover various modification and equivalent arrangements. In addition, while the various elements of the preferred embodiments are shown in various combinations and configurations, which are exemplary, other combinations and configuration, including more, less or only a single element, are also within the spirit and scope of the invention.

What is claimed is:

1. An angular velocity detector comprising:
an angular velocity detecting element including a base substrate having a rectangular shape, and a vibrating body arranged in the base substrate to be vibrated on a surface horizontal with respect to the base substrate, wherein the angular velocity detecting element detects an angular velocity around an axis perpendicular to the base substrate based on a vibration of the vibrating body;
a circuit substrate laminated with the angular velocity detecting element to be bonded to a first surface of the base substrate of the angular velocity detecting element through an adhesive; and
a bonding wire through which a second surface of the base substrate of the angular velocity detecting element, opposite to the first surface, is electrically connected to the circuit substrate,
wherein the adhesive is partially arranged on four corner areas of the first surface of the base substrate corresponding to a bonding portion of the bonding wire on the second surface of the base substrate.

2. The angular velocity detector according to claim 1, wherein:
the angular velocity detecting element is arranged above the circuit substrate; and
the adhesive is partially provided on the first surface of the base substrate below the bonding portion of the bonding wire in the base substrate.

3. The angular velocity detector according to claim 1, wherein:
a plurality of the bonding wires are arranged at different bonding portions in the base substrate; and
the adhesive is partially arranged on the first surface of the base substrate at least at portions corresponding to the bonding portions of the bonding wires in the base substrate.

4. The angular velocity detector according to claim 1, further comprising
a package for accommodating the angular velocity detecting element and the circuit substrate,
wherein the circuit substrate is mounted on the package to be fixed to the package.

5. The angular velocity detector according to claim 1, wherein:
the adhesive has a constricted shape.

6. The angular velocity detector according to claim 1, wherein:
the adhesive is made of two film members bonded to each other.

7. The angular velocity detector according to claim 1, wherein:
the adhesive has a trapezoidal shape.

8. The angular velocity detector according to claim 1, wherein:
a sectional shape of the adhesive has a trapezoidal shape in which a side on the angular velocity detecting element is short.

9. An angular velocity detector comprising:
an angular velocity detecting element including a base substrate having a rectangular shape, and a vibrating body arranged in the base substrate to be vibrated on a surface horizontal with respect to the base substrate, wherein the angular velocity detecting element detects an angular velocity around an axis perpendicular to the base substrate based on a vibration of the vibrating body;
a circuit substrate laminated with the angular velocity detecting element to be bonded to a first surface of the base substrate of the angular velocity detecting element through an adhesive; and
a bonding wire through which a second surface of the base substrate of the angular velocity detecting element, opposite to the first surface, is electrically connected to the circuit substrate, wherein:
the adhesive is partially arranged on four corner areas of the first surface of the base substrate in an arrangement area; and
the bonding wire is connected to the angular velocity detecting element at a position within a projecting area on the second surface of the arrangement area.

10. The angular velocity detector according to claim 9, wherein:
the angular velocity detecting element is arranged above the circuit substrate; and
the projecting area is a vertically projected portion of the arrangement area relative to the second surface.

11. The angular velocity detector according to claim 9, wherein:
a plurality of the bonding wires are arranged at different bonding portions in the base substrate; and
the bonding wires are bonded to the second surface of the angular velocity detecting element at positions within the projecting area.

12. The angular velocity detector according to claim 9, wherein:
the adhesive has a constricted shape.

13. The angular velocity detector according to claim 9, wherein:
the adhesive is made of two film members bonded to each other.

14. The angular velocity detector according to claim 9, wherein:
the adhesive has a trapezoidal shape.

15. The angular velocity detector according to claim 9, wherein:
a sectional shape of the adhesive has a trapezoidal shape in which a side on the angular velocity detecting element is short.

16. An angular velocity detector comprising:
an angular velocity detecting element including a base substrate, and a vibrating body arranged in the base substrate to be vibrated on a surface horizontal with respect to the base substrate, wherein the angular velocity detecting element detects an angular velocity around an axis perpendicular to the base substrate based on a vibration of the vibrating body;

a circuit substrate laminated with the angular velocity detecting element to be bonded to a bottom surface of the base substrate of the angular velocity detecting element through an adhesive; and a bonding wire through which an upper surface of the base substrate of the angular velocity detecting element is electrically connected to the circuit substrate, wherein the adhesive is partially arranged on a peripheral portion of the bottom surface of the base substrate symmetrically, to support the angular velocity detecting element, the adhesive having a constricted shape constricted at a center portion in its thickness direction.

17. An angular velocity detector comprising:

an angular velocity detecting element including a base substrate, and a vibrating body arranged in the base substrate to be vibrated on a surface horizontal with respect to the base substrate, wherein the angular velocity detecting element detects an angular velocity around an axis perpendicular to the base substrate based on a vibration of the vibrating body;

a circuit substrate laminated with the angular velocity detecting element to be bonded to a first surface of the base substrate of the angular velocity detecting element through an adhesive; and a bonding wire through which a second surface of the base substrate of the angular velocity detecting element, opposite to the first surface, is electrically connected to the circuit substrate, wherein the adhesive is partially arranged on the first surface of the base substrate at least at a portion corresponding to a bonding portion of the bonding wire on the second surface of the base substrate and the adhesive has a constricted shape constricted at a center portion in its thickness direction.

* * * * *